United States Patent
Hebiguchi

(10) Patent No.: US 10,254,313 B2
(45) Date of Patent: Apr. 9, 2019

(54) NONCONTACT VOLTAGE MEASUREMENT APPARATUS

(71) Applicant: Alps Electric Co., Ltd., Ota-ku, Tokyo (JP)

(72) Inventor: Hiroyuki Hebiguchi, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 68 days.

(21) Appl. No.: 15/718,950

(22) Filed: Sep. 28, 2017

(65) Prior Publication Data

US 2018/0017597 A1   Jan. 18, 2018

Related U.S. Application Data

(63) Continuation of application No. PCT/JP2016/062723, filed on Apr. 22, 2016.

(30) Foreign Application Priority Data

Apr. 28, 2015  (JP) ................................ 2015-092096

(51) Int. Cl.
*G01R 29/22* (2006.01)
*G01R 5/28* (2006.01)
(Continued)

(52) U.S. Cl.
CPC ............... *G01R 5/28* (2013.01); *G01R 5/30* (2013.01); *G01R 15/16* (2013.01); *G01R 15/165* (2013.01); *G01R 19/0084* (2013.01)

(58) Field of Classification Search
CPC .......... G01R 29/12; G01R 29/24; G01R 5/28; G01R 15/165; G01R 29/14; G01R 15/148
(Continued)

(56) References Cited

U.S. PATENT DOCUMENTS

| | | | |
|---|---|---|---|
| 8,680,845 B2 * | 3/2014 | Carpenter | G01R 1/22 324/156 |
| 9,970,962 B2 * | 5/2018 | Hsu | G01R 35/005 |
| 2010/0087966 A1 * | 4/2010 | Terazawa | G05D 3/12 700/302 |

FOREIGN PATENT DOCUMENTS

| | | |
|---|---|---|
| JP | 54-36980 | 3/1979 |
| JP | 02-110383 | 4/1990 |

(Continued)

OTHER PUBLICATIONS

International Search Report from International Application No. PCT/JP2016/062723 dated Aug. 2, 2016.

*Primary Examiner* — Jermele M Hollington
*Assistant Examiner* — Raul J Rios Russo
(74) *Attorney, Agent, or Firm* — Beyer Law Group LLP

(57) ABSTRACT

A noncontact voltage measurement apparatus includes a sensing electrode to which a voltage corresponding to an alternating current voltage is applied, a feedback electrode, a conductive movable body that is supported so as to be displaceable in accordance with the Coulomb force generated between the movable body and the sensing electrode and the Coulomb force generated between the movable body and the feedback electrode, an elastic force for causing the movable body to return to a predetermined neutral position acting on the movable body, a displacement detection unit configured to detect a displacement of the movable body, a voltage applying unit configured to apply an alternating current voltage to the feedback electrode, and a control unit configured to control the voltage to be output from the voltage applying unit such that a detection result of the displacement from the displacement detection unit approaches a predetermined reference value.

12 Claims, 8 Drawing Sheets

(51) Int. Cl.
  *G01R 15/16* (2006.01)
  *G01R 19/00* (2006.01)
  *G01R 5/30* (2006.01)

(58) Field of Classification Search
  USPC .................................. 324/76.11–76.83, 109
  See application file for complete search history.

(56) References Cited

FOREIGN PATENT DOCUMENTS

JP          5-5751        1/1993
JP          5-27684 U     4/1993

\* cited by examiner

NONCONTACT VOLTAGE MEASUREMENT APPARATUS

CLAIM OF PRIORITY

This application is a Continuation of International Application No. PCT/JP2016/062723 filed on Apr. 22, 2016, which claims benefit of Japanese Patent Application No. 2015-092096 filed on Apr. 28, 2015. The entire contents of each application noted above are hereby incorporated by reference.

BACKGROUND OF THE INVENTION

1. Field of the Invention

The present invention relates to a noncontact voltage measurement apparatus that measures, without being electrically connected to a conductor, an alternating current voltage applied to the conductor.

2. Description of the Related Art

A noncontact voltage measurement apparatus that may measure, without being electrically connected to a measurement target, a voltage applied to the measurement target is known. For example, Japanese Unexamined Patent Application Publication No. 5-5751 describes an apparatus that detects, as a change in the weight of a sensing electrode, the Coulomb force acting between an electrode to which a direct-current high voltage is applied and the sensing electrode and measures the change in weight using a scale.

However, since the Coulomb force is significantly small, practical accuracy may not be achieved by using a method for measuring a change in the weight of a sensing electrode, the method being described in Japanese Unexamined Patent Application Publication No. 5-5751, unless electric field intensity is extremely high (6 to 8 MV/m in an example described in Japanese Unexamined Patent Application Publication No. 5-5751). Thus, for example an alternating current voltage of about 100 to 200 V from for example a commercial power source may not be measured with high accuracy by using this method.

SUMMARY OF THE INVENTION

The present invention has been made in light of such circumstances and provides a noncontact voltage measurement apparatus that may measure an alternating current voltage with high accuracy.

A noncontact voltage measurement apparatus according to the present invention measures, without being electrically connected to a conductive measurement target, an alternating current voltage applied to the measurement target. This noncontact voltage measurement apparatus includes a sensing electrode to which a voltage corresponding to the alternating current voltage is applied, a feedback electrode, a conductive movable body that is supported so as to be displaceable in accordance with the Coulomb force generated between the movable body and the sensing electrode and the Coulomb force generated between the movable body and the feedback electrode, an elastic force for causing the movable body to return to a predetermined neutral position acting on the movable body, a displacement detection unit configured to detect a displacement of the movable body, a voltage applying unit configured to apply a voltage to the feedback electrode, and a control unit configured to control the voltage to be output from the voltage applying unit such that a detection result of the displacement from the displacement detection unit approaches a predetermined reference value indicating the neutral position.

With the above-described configuration, the Coulomb force is generated between the movable body and the sensing electrode to which the voltage corresponding to the alternating current voltage of the measurement target is applied, the Coulomb force is generated between the movable body and the feedback electrode to which the voltage is applied by the voltage applying unit, and the movable body is displaced in accordance with the Coulomb forces. In addition, since the elastic force for causing the movable body to return to the predetermined neutral position acts on the movable body, the movable body is displaced in the direction toward the neutral position when these Coulomb forces become smaller. The control unit controls the voltage of the voltage applying unit such that the displacement of the movable body detected by the displacement detection unit approaches the predetermined reference value indicating the neutral position. Under this control, the Coulomb forces acting on the movable body approach zero and the voltage from the voltage applying unit approaches the voltage of the sensing electrode. A measurement value of the alternating current voltage is thus obtained from the voltage of the voltage applying unit.

Preferably, the noncontact voltage measurement apparatus may further include a first capacitive coupling electrode that is capacitively coupled to the measurement target and is electrically connected to the sensing electrode.

As a result, the voltage corresponding to the alternating current voltage applied to the measurement target is applied to the sensing electrode through a capacitive coupling between the measurement target and the first capacitive coupling electrode.

Preferably, the noncontact voltage measurement apparatus may further include a switch unit configured to short-circuit the sensing electrode and the feedback electrode. The control unit may cause the switch unit to enter an ON state before measuring the alternating current voltage, acquire, as the reference value, a detection result from the displacement detection unit in the ON state, and cause the switch unit to enter an OFF state when measuring the alternating current voltage.

As a result, even in the case where the reference value is varied in accordance with for example environments, the latest and appropriate reference value is acquired before measurement of the alternating current voltage, and thus the accuracy of measurement of the alternating current voltage is further improved.

Preferably, the noncontact voltage measurement apparatus may further include a second capacitive coupling electrode that is capacitively coupled to the measurement target in a noncontact manner. The voltage applying unit may amplify an input alternating current signal with a gain corresponding to a gain control signal, and apply a voltage resulting from the amplification to the feedback electrode. The control unit may include an alternating current signal generation unit configured to generate the alternating current signal proportional to the alternating current voltage of the measurement target on the basis of a signal input from the second capacitive coupling electrode, and a gain control unit configured to adjust the gain control signal such that the detection result from the displacement detection unit approaches the reference value.

With the above-described configuration, the voltage of the feedback electrode is generated by amplifying the alternating current signal proportional to the alternating current voltage of the measurement target. Thus, the alternating current voltage agrees with the voltage of the feedback electrode with high accuracy.

Preferably, the displacement detection unit may have a magnet and a magnetic detection unit configured to detect a magnetic field formed by the magnet. One of the magnet and the magnetic detection unit may be provided at the movable body, and the other one of the magnet and the magnetic detection unit may be fixed to a base serving as a reference for detection of the displacement. The displacement detection unit may output, as the detection result of the displacement, a detection result of the magnetic field from the magnetic detection unit.

As a result, the Coulomb force acting on the movable body changes in accordance with the voltage applied to the feedback electrode by the voltage applying unit, the change in the Coulomb force leads to a displacement of the movable body, and the displacement is detected by the magnetic detection unit as a change in the magnetic field formed by the magnet. The magnetic field detected by the magnetic detection unit thus changes sensitively in accordance with the voltage applied to the feedback electrode.

Preferably, one of the magnet and the magnetic detection unit that is provided at the movable body may be at a reference position in the case where the movable body is at the neutral position. The other one of the magnet and the magnetic detection unit that is provided at the base may be installed at a position displaced, with respect to the reference position, in a direction perpendicular to a direction in which one of the magnet and the magnetic detection unit is displaced from the reference position together with displacement of the movable body.

As a result, in the case where the movable body is at the neutral position, the distance between the magnet and the magnetic detection unit becomes short, and the detection value of the magnetic field from the magnetic detection unit becomes large.

Alternatively, the other one of the magnet and the magnetic detection unit that is provided at the base may be installed at a position displaced, with respect to the reference position, in a direction parallel to a direction in which one of the magnet and the magnetic detection unit is displaced from the reference position together with displacement of the movable body.

As a result, on the basis of the detection result from the magnetic detection unit, it is possible to distinguish the case where the movable body is attracted toward the sensing electrode with respect to the neutral position from the case where the movable body is attracted toward the feedback electrode.

Preferably, the noncontact voltage measurement apparatus may further include another magnetic detection unit identical to the magnetic detection unit. One of the magnetic detection units may be installed at a position displaced, with respect to the reference position of the magnet, in a first direction parallel to the direction in which the movable unit is displaced from the reference position. The other one of the magnetic detection units may be installed at a position displaced, with respect to the reference position of the magnet, in a second direction opposite to the first direction from the reference position. The control unit may control the voltage to be output from the voltage applying unit such that the difference between a detection value of the magnetic field formed by the magnet, the detection value being detected by the one of the magnetic detection units, and a detection value of the magnetic field formed by the magnet, the detection value being detected by the other one of the magnetic detection units, approaches a predetermined value.

As a result, the detection sensitivity of the displacement of the movable body improves.

Preferably, the displacement detection unit may have a conductive probe provided at the movable body and having a tip portion tapered down toward a surface of the feedback electrode or a conductive probe provided at the feedback electrode and having a tip portion tapered down toward a surface of the movable body, a voltage source configured to apply a voltage between the probe and the feedback electrode, and a current detection unit configured to detect a current caused to flow from the probe to the feedback electrode due to field emission, and may output, as the detection result of the displacement, a detection result of the current from the current detection unit.

Preferably, the sensing electrode and the feedback electrode may be arranged so as to face each other. At least a portion of the movable body may be positioned between the sensing electrode and the feedback electrode.

According to the present invention, an alternating current voltage may be measured with high accuracy without being electrically connected to a measurement target.

DESCRIPTION OF THE PREFERRED EMBODIMENTS

First Embodiment

In the following, a noncontact voltage measurement apparatus according to a first embodiment of the present invention will be described with reference to the drawings.

Figure 1:
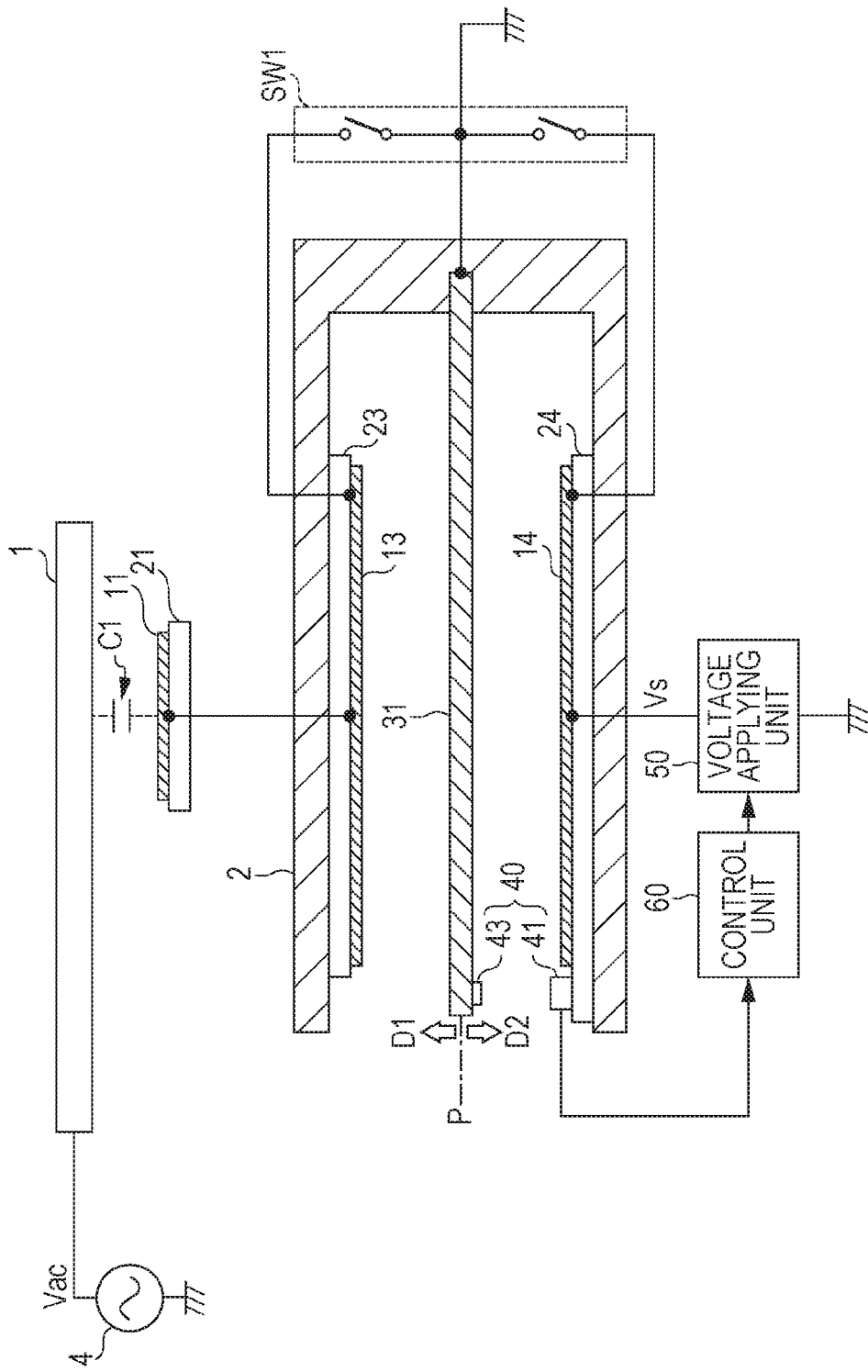
FIG. 1 is a diagram illustrating an example of the configuration of a noncontact voltage measurement apparatus according to a first embodiment.

FIG. 1 is a diagram illustrating an example of the configuration of the noncontact voltage measurement apparatus according to the present embodiment. The noncontact voltage measurement apparatus illustrated in FIG. 1 measures, without being electrically connected to a conductive measurement target 1, an alternating current voltage Vac applied to the measurement target 1. The noncontact voltage measurement apparatus measures the alternating current voltage Vac using the Coulomb force generated between a conductive movable body 31 and a sensing electrode 13 and the Coulomb force generated between the movable body 31 and a feedback electrode 14. Note that "without being electrically connected" in this case means that the measurement target is electrically isolated from the noncontact voltage measurement apparatus in a direct-current manner, and also includes a case where an insulator is interposed between the measurement target and the noncontact voltage measurement apparatus and a case where the measurement target and the noncontact voltage measurement apparatus are separated with a space therebetween. In the example of FIG. 1, the noncontact voltage measurement apparatus includes a first capacitive coupling electrode 11, the sensing electrode 13, the feedback electrode 14, the movable body 31, a displacement detection unit 40, a voltage applying unit 50, a control unit 60, and a switch unit SW1.

The measurement target 1 is, for example, an electric wire connected to an alternating current power supply 4 such as a commercial power network, or a bus bar provided at an electric switchboard or the like. The first capacitive coupling electrode 11 is capacitively coupled to the measurement target 1. The first capacitive coupling electrode 11 is formed, for example, as a conductive pattern on an insulating substrate 21 (a printed board, a flexible board, or the like). The first capacitive coupling electrode 11 and the sensing electrode 13 are conducting and for example are electrically connected by wiring.

The sensing electrode 13 and the feedback electrode 14 are arranged so as to face each other, and form a parallel-plate capacitor. Similarly to the first capacitive coupling electrode 11, the sensing electrode 13 is formed as a conductive pattern on a substrate 23, and the feedback electrode 14 is formed as a conductive pattern on a substrate 24. The substrates 23 and 24 are fixed to a common base 2.

The movable body 31 is a conductor supported so as to be displaceable in accordance with the Coulomb force generated between the movable body 31 and the sensing electrode 13 and the Coulomb force generated between the movable body 31 and the feedback electrode 14, and an elastic force for causing the movable body 31 to return to a predetermined neutral position P acts on the movable body 31. In the example of FIG. 1, the movable body 31 is a plate-like conductive member having elasticity and having one end portion fixed to the base 2, and extends from the fixed end in parallel with surfaces of the sensing electrode 13 and feedback electrode 14, the surfaces facing the movable body 31. The end portion of the movable body 31 opposite to the fixed end is open, and the open end is displaceable in directions perpendicular to the direction in which the movable body 31 extends. The movable body 31 is connected to an area having a reference potential (hereinafter referred to as "ground") that serves as a reference for measurement of the alternating current voltage Vac.

The displacement detection unit 40 detects the displacement of the movable body 31. In the example of FIG. 1, the displacement detection unit 40 has a magnet 43 and a magnetic detection unit 41. The magnet 43 is provided near the open end of the movable body 31, and is displaced together with the movable body 31. The magnetic detection unit 41 is a sensor that detects a magnetic field formed by the magnet 43, and is arranged on the substrate 24 in the example of FIG. 1. The magnetic detection unit 41 is fixed to the base 2 with the substrate 24 interposed therebetween, the base 2 serving as a reference for displacement of the movable body 31.

The magnetic detection unit 41 is installed at a position displaced, with respect to the reference position of the magnet 43 (the position illustrated in FIG. 1) in the case where the open end of the movable body 31 is at the neutral position P (the case where the sensing electrode 13 and the feedback electrode 14 have the same electric potential), in a direction (a direction denoted by an arrow D2 in FIG. 1) parallel to a direction in which the movable body 31 is displaced from the reference position.

The voltage applying unit 50 is a circuit that applies an alternating current voltage Vs to the feedback electrode 14, and changes the amplitude, frequency, and phase of the alternating current voltage Vs under control of the control unit 60.

The switch unit SW1 short-circuits the sensing electrode 13 and the feedback electrode 14. In the example of FIG. 1, the switch unit SW1 has a switch element provided between the sensing electrode 13 and the ground and a switch element provided between the feedback electrode 14 and the ground. The switch unit SW1 turns on-off under control of the control unit 60.

The control unit 60 controls the alternating current voltage Vs to be output from the voltage applying unit 50 such that a displacement detection result from the displacement detection unit 40 approaches a predetermined reference value indicating the neutral position P. The control unit 60 includes a computer that executes processing in accordance with instruction codes of a program stored for example in a memory or a dedicated logic circuit (such as an ASIC) that executes specific processing.

Here, an operation of the noncontact voltage measurement apparatus having the above-described configuration and illustrated in FIG. 1 will be described.

First, the control unit 60 causes the switch unit SW1 to enter an ON state before measuring the alternating current voltage Vac, and acquires, as the above-described reference value, a detection result from the displacement detection unit 40 in the ON state (a detection value of the magnetic field from the magnetic detection unit 41). When the switch unit SW1 enters the ON state, all the sensing electrode 13, the feedback electrode 14, and the movable body 31 have the same electric potential, and the electric charge accumulated in the sensing electrode 13, the feedback electrode 14, and the movable body 31 is initialized to zero. In this case, no Coulomb force acts on the movable body 31, and thus the movable body 31 is at the predetermined neutral position P. Thus, the reference value that the control unit 60 acquires from the displacement detection unit 40 when the switch unit SW1 is in the ON state indicates that the movable body 31 is at the neutral position P.

The control unit 60 sets the switch unit SW1 to an OFF state after acquiring the reference value from the displacement detection unit 40, and starts measuring the alternating current voltage Vac.

When starting the measurement, the control unit 60 sets the alternating current voltage Vs of the voltage applying unit 50 to a level (for example, zero) that is sufficiently smaller than the alternating current voltage Vac. In this case, the electric charge accumulated in the movable body 31 and the sensing electrode 13 reaches a maximum value while changing its positive-negative polarity every half the period of the alternating current voltage Vac. When the electric charge reaches the maximum value, the Coulomb force generated between the movable body 31 and the sensing electrode 13 becomes maximum, the movable body 31 is attracted toward the sensing electrode 13, and the detection value of the magnetic field from the magnetic detection unit 41 becomes minimum. The detection result from the magnetic detection unit 41 thus oscillates with half the period of the alternating current voltage Vac. The control unit 60 detects the frequency and phase of the alternating current voltage Vac on the basis of the detection result from the magnetic detection unit 41 at the start of the measurement, and causes the frequency and phase of the alternating current voltage Vs to synchronize with the detected frequency and phase.

Next, the control unit 60 performs smoothing (low-pass filter processing) on the detection result from the magnetic detection unit 41, and adjusts the amplitude of the alternating current voltage Vs on the basis of the mean value of the detection result.

When the amplitude of the alternating current voltage Vs of the voltage applying unit 50 is smaller than that of the alternating current voltage Vac, the electric potential difference between the movable body 31 (the ground) and the feedback electrode 14 becomes averagely smaller than the electric potential difference between the movable body 31 and the sensing electrode 13. In this case, the Coulomb force generated between the movable body 31 and the feedback electrode 14 becomes averagely smaller than the Coulomb force generated between the movable body 31 and the sensing electrode 13, and thus the movable body 31 is attracted toward the sensing electrode 13 with respect to the neutral position P and is displaced in the direction denoted by an arrow D1. As a result, the magnet 43 is moved away from the magnetic detection unit 41, and thus the detection value of the magnetic field from the magnetic detection unit 41 averagely becomes smaller. That is, when the amplitude of the alternating current voltage Vs is smaller than that of the alternating current voltage Vac, the detection value of the magnetic field from the magnetic detection unit 41 averagely becomes smaller than the reference value (the detection value from the magnetic detection unit 41 in the case where the movable body 31 is at the neutral position P).

In contrast, when the amplitude of the alternating current voltage Vs of the voltage applying unit 50 is greater than that of the alternating current voltage Vac, the detection value of the magnetic field from the magnetic detection unit 41 averagely becomes greater than the reference value unlike in the above-described case.

Thus, the control unit 60 causes the mean value of the magnetic field detected by the magnetic detection unit 41 to approach the reference value by performing negative feedback control such that the amplitude of the alternating current voltage Vs is increased when the mean value is smaller than the reference value, and the amplitude of the alternating current voltage Vs is reduced when the mean value is greater than the reference value.

When the mean value of the magnetic field detected by the magnetic detection unit 41 becomes nearly equal to the reference value, the movable body 31 is at the neutral position P. Thus, the Coulomb forces acting on the movable body 31 are almost zero, and the feedback electrode 14 and the sensing electrode 13 have almost the same electric potential. The feedback electrode 14 and the sensing electrode 13 having the same electric potential mean that almost no current flows through a parasitic capacitor C1 between the first capacitive coupling electrode 11 and the measurement target 1, and thus the first capacitive coupling electrode 11 and the measurement target 1 have almost the same electric potential. Thus, the alternating current voltage Vs of the voltage applying unit 50 becomes almost equal to the alternating current voltage Vac of the measurement target 1.

Since the alternating current voltage Vs becomes almost equal to the alternating current voltage Vac, for example, the control unit 60 may acquire an amplitude measurement result of the alternating current voltage Vac on the basis of for example an amplitude set value set to adjust the amplitude of the alternating current voltage Vs of the voltage applying unit 50.

Note that in the case where the control unit 60 includes an analog circuit, a voltage measurement device may be additionally provided to measure the amplitude of the alternating current voltage Vs, and an output from the voltage measurement device may be treated as a measurement result of the alternating current voltage Vac.

As described above, according to the noncontact voltage measurement apparatus according to the present embodiment, the Coulomb force is generated between the movable body 31, which is a conductor, and the sensing electrode 13 to which a voltage corresponding to the alternating current voltage Vac of the measurement target 1 is applied, the Coulomb force is generated between the movable body 31 and the feedback electrode 14 to which the alternating current voltage Vs is applied, and the movable body 31 is displaced in accordance with the Coulomb forces. In addition, since the elastic force for causing the movable body 31 to return to the predetermined neutral position P acts on the movable body 31, the movable body 31 is displaced in the direction toward the neutral position P when the Coulomb forces become smaller. The control unit 60 controls the alternating current voltage Vs of the voltage applying unit 50 such that the displacement of the movable body 31 detected by the displacement detection unit 40 approaches the predetermined reference value indicating the neutral position P. Under this control, the Coulomb forces acting on the movable body 31 approach zero and the alternating current voltage Vs approaches the voltage of the sensing electrode 13. Thus, a measurement value of the alternating current voltage Vac may be acquired from the alternating current voltage Vs of the voltage applying unit 50.

In addition, feedback control is performed on the alternating current voltage Vs such that the movable body 31 approaches the neutral position P where no Coulomb force acts on the movable body 31 in the noncontact voltage measurement apparatus according to the present embodiment. Thus, measurement results are not affected by the relationship between the magnitude of force required to displace the movable body 31 and the Coulomb forces acting on the movable body 31. Consequently, the accuracy of measurement may be significantly improved compared with an existing apparatus that measures the Coulomb force acting on an electrode using for example a scale.

In addition, a sufficient amount of displacement may be acquired by appropriately setting the elastic force for the movable body 31 even when the Coulomb forces acting on the movable body 31 are very small. Consequently, lower voltages may be measured with high accuracy compared with existing apparatuses.

In addition, according to the noncontact voltage measurement apparatus according to the present embodiment, the switch unit SW1 is caused to enter the ON state before the measurement of the alternating current voltage Vac, and the detection result from the displacement detection unit 40 in the ON state is acquired as the reference value indicating the neutral position P.

Thus, even in the case where the reference value is varied in accordance with for example environments, the latest and appropriate reference value may be acquired before measurement of the alternating current voltage Vac. Consequently, the accuracy of measurement of the alternating current voltage Vac may further be improved.

In addition, according to the noncontact voltage measurement apparatus according to the present embodiment, a change in the voltage (V) applied to the feedback electrode 14 leads to a change in the Coulomb force (F) acting on the movable body 31, the change in the Coulomb force (F) leads to a displacement (D) of the movable body 31, and the displacement (D) is detected as a change in the magnetic field (H) of the magnet 43. The voltage (V), the Coulomb force (F), the displacement (D), and the magnetic field (H) generally have the following relationships.

$$F \propto V^2 \quad (1)$$

$$D \propto F \quad (2)$$

$$H \propto 1/D^2 \propto 1/V^4 \quad (3)$$

As is clear from Expression (3), the magnetic field (H) changes significantly sensitively with respect to the voltage (V) applied to the feedback electrode 14. Thus, even when the Coulomb force is very small, the displacement of the movable body 31 may be detected highly sensitively. As a result, the accuracy of the feedback control is improved, and the voltage measurement may be performed with high accuracy.

For example, the capacitance of a varicap that is a general variable-capacitance element is proportional to the inverse of the square root of a voltage applied to the varicap. Thus, a change in the capacitance of the varicap with respect to the voltage is significantly insensitive compared with for example Expression (3). Thus, according to the noncontact voltage measurement apparatus according to the present embodiment, the accuracy and resolution of voltage measurement may be improved compared with a method for measuring an alternating current voltage using a varicap.

In addition, according to the noncontact voltage measurement apparatus according to the present embodiment, the magnetic detection unit 41 is installed at the position displaced, with respect to the reference position of the magnet 43 in the case where the open end of the movable body 31 is at the neutral position P (the position illustrated in FIG. 1), in a direction parallel to the direction (the direction denoted by the arrow D1 in FIG. 1) in which the movable body 31 is displaced from the reference position. As a result, on the basis of the detection result from the magnetic detection unit 41, it is possible to distinguish the case where the movable body 31 is attracted toward the sensing electrode 13 with respect to the neutral position P from the case where the movable body 31 is attracted toward the feedback electrode 14. Consequently, the feedback control performed by the control unit 60 may be simplified.

Second Embodiment

Figure 2:
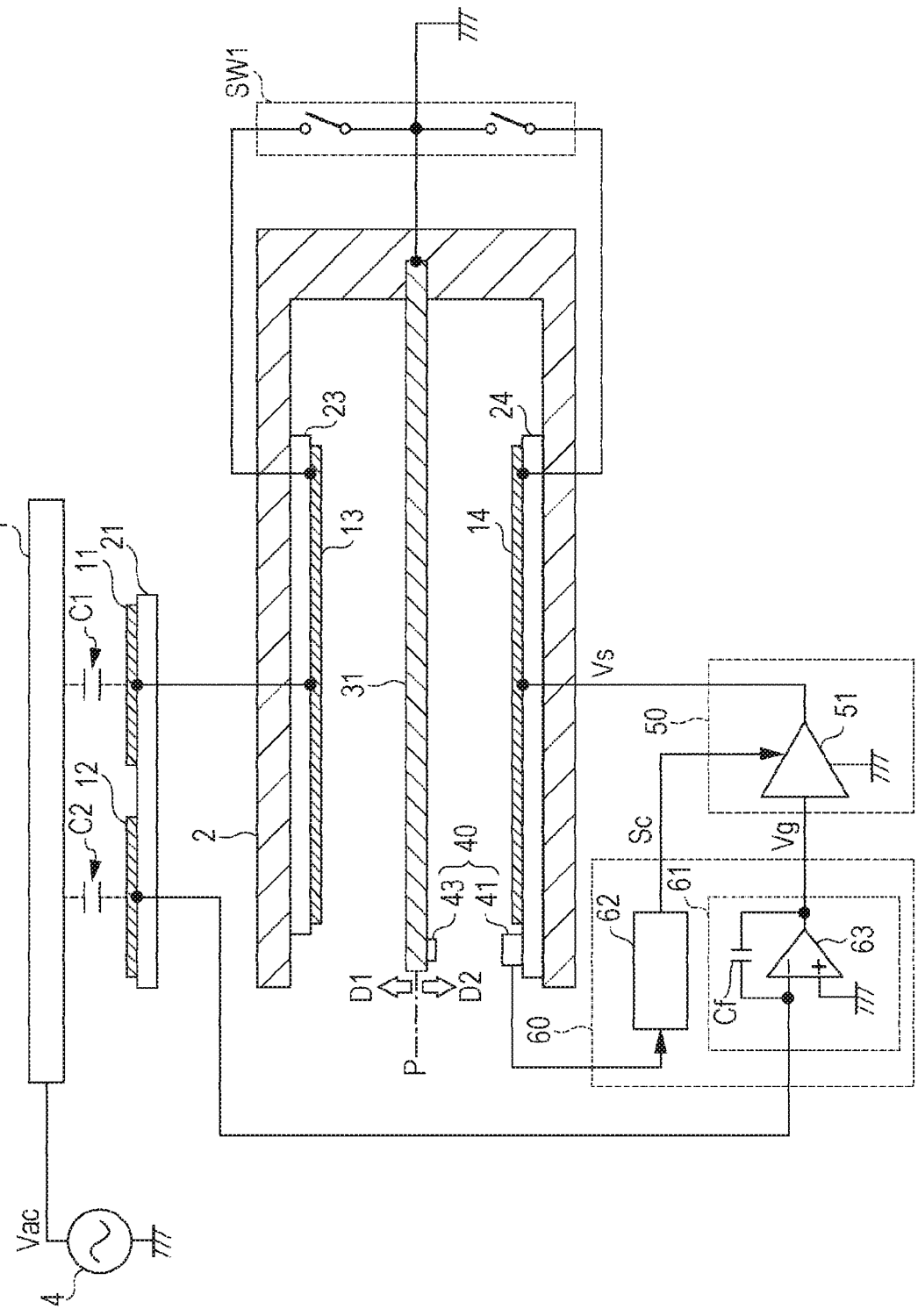
FIG. 2 is a diagram illustrating an example of the configuration of a noncontact voltage measurement apparatus according to a second embodiment.

Next, a second embodiment of the present invention will be described. FIG. 2 is a diagram illustrating an example of the configuration of a noncontact voltage measurement apparatus according to the second embodiment.

The noncontact voltage measurement apparatus illustrated in FIG. 2 has a second capacitive coupling electrode 12 in addition to a configuration substantially the same as that of the noncontact voltage measurement apparatus illustrated in FIG. 1. In addition, the control unit 60 includes an alternating current signal generation unit 61 and a gain control unit 62, and the voltage applying unit 50 includes a variable gain amplifier 51.

Similarly to the first capacitive coupling electrode 11, the second capacitive coupling electrode 12 is capacitively coupled to the measurement target 1 in a noncontact manner. In the example of FIG. 2, the second capacitive coupling electrode 12 is formed as a conductive pattern on the substrate 21, which is common to the first capacitive coupling electrode 11 and the second capacitive coupling electrode 12.

The voltage applying unit 50 includes the variable gain amplifier 51 that amplifies an alternating current signal Vg input from the control unit 60 with a gain corresponding to a gain control signal Sc and outputs the amplification result as an alternating current voltage Vs.

The alternating current signal generation unit 61 is a circuit that generates, on the basis of a signal input from the second capacitive coupling electrode 12, the alternating current signal Vg proportional to the alternating current voltage Vac applied to the measurement target 1. The alternating current signal generation unit 61 includes an operational amplifier 63 and a capacitor Cf in the example of FIG. 2. The capacitor Cf is connected between an output terminal and an inverting input terminal of the operational amplifier 63. The inverting input terminal of the operational amplifier 63 is connected to the second capacitive coupling electrode 12, and a non-inverting input terminal is connected to the ground. When the parasitic capacitance between the second capacitive coupling electrode 12 and the measurement target 1 is denoted by "C2" and the capacitance of the capacitor Cf is denoted by "Cf", the alternating current signal Vg has a value obtained by multiplying the alternating current voltage Vac by a proportionality factor "C2/Cf".

The gain control unit 62 adjusts the gain control signal Sc such that a detection result from the displacement detection unit 40 approaches the reference value indicating the neutral position P. That is, the gain control unit 62 obtains, using for example a low-pass filter, the mean value of a magnetic field detected by the magnetic detection unit 41. The gain control unit 62 performs negative feedback control such that the amplitude of the alternating current voltage Vs is increased when the mean value is smaller than a reference value, and the amplitude of the alternating current voltage Vs is reduced when the mean value is greater than the reference value.

According to the noncontact voltage measurement apparatus according to the present embodiment, the alternating current voltage Vs is generated by amplifying the alternating current signal Vg proportional to the alternating current voltage Vac. Thus, the frequency and phase of the alternating current voltage Vac may be made to agree with those of the alternating current voltage Vs with higher accuracy. Consequently, the alternating current voltage Vac may be measured with further higher accuracy.

Third Embodiment

Figure 3:
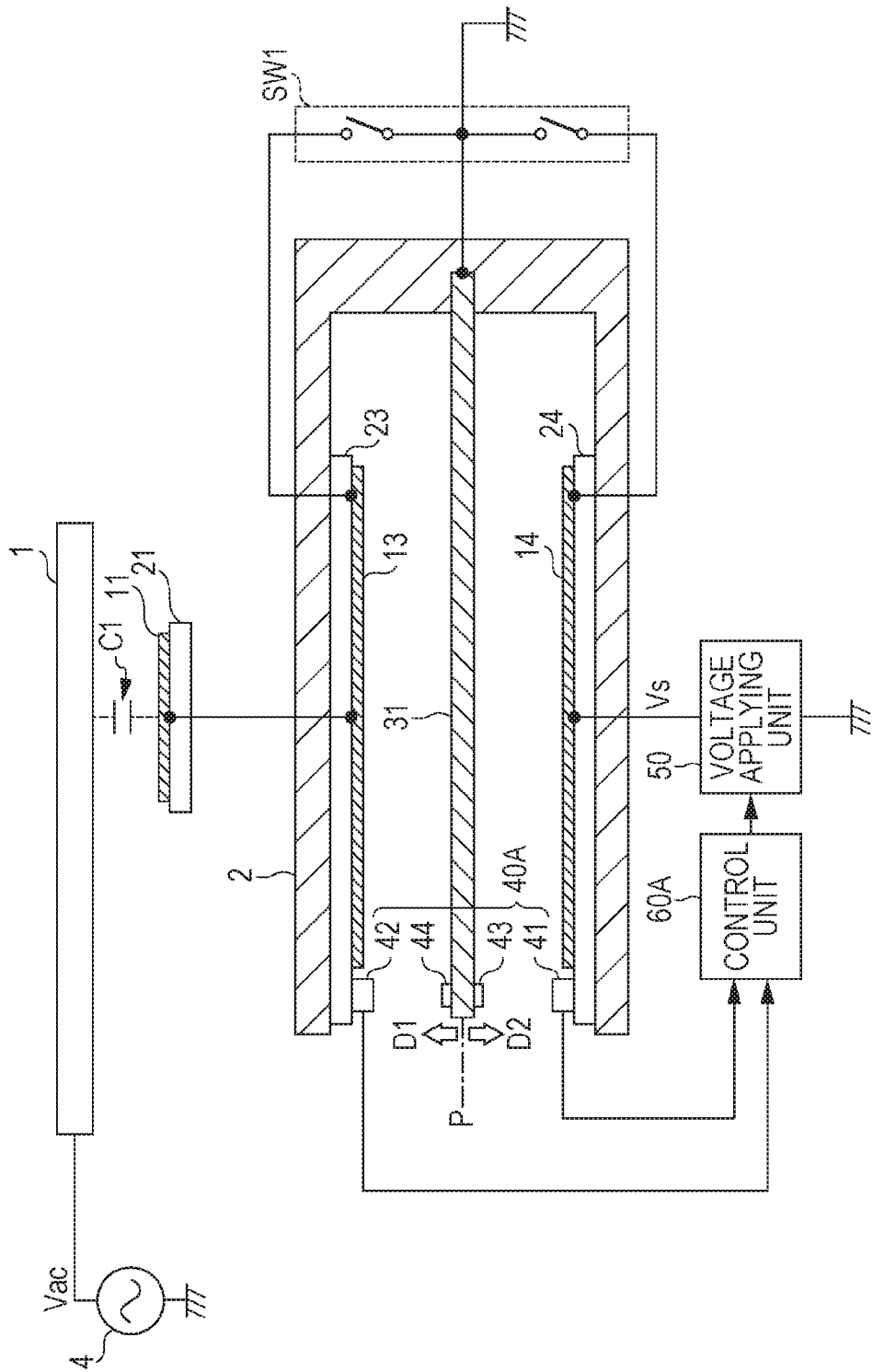
FIG. 3 is a diagram illustrating an example of the configuration of a noncontact voltage measurement apparatus according to a third embodiment.

Next, a third embodiment of the present invention will be described. FIG. 3 is a diagram illustrating an example of the configuration of a noncontact voltage measurement apparatus according to the third embodiment.

The noncontact voltage measurement apparatus illustrated in FIG. 3 is obtained by replacing the displacement detection unit 40 of the noncontact voltage measurement apparatus illustrated in FIG. 1 with a displacement detection unit 40A and by replacing the control unit 60 with a control unit 60A. The rest of the configuration of the noncontact voltage measurement apparatus illustrated in FIG. 3 is the same as that of the noncontact voltage measurement apparatus illustrated in FIG. 1.

The displacement detection unit 40A has a magnet 44 and a magnetic detection unit 42 in addition to the magnet 43 and the magnetic detection unit 41 (FIG. 1), which have already been described.

The magnet 44 is provided near the open end of the movable body 31 on a surface of the movable body 31 that is the farthest from the surface of the movable body 31 on which the magnet 43 is mounted. The magnet 44 is displaced together with the movable body 31 similarly to the magnet 43.

The magnetic detection unit 42 is a sensor that detects a magnetic field formed by the magnet 44, and is mounted and arranged on the substrate 23 in the example of FIG. 3. The magnetic detection unit 42 is fixed to the base 2 with the substrate 23 interposed therebetween similarly to the magnetic detection unit 41.

The magnetic detection unit 42 is installed at a position displaced, with respect to the reference position of the magnet 44 (the position illustrated in FIG. 3) in the case where the open end of the movable body 31 is at the neutral position P, in a direction denoted by the arrow D1 in which the movable body 31 is displaced from the reference position. The direction denoted by the arrow D1 in which the magnetic detection unit 42 is displaced from the reference position of the magnet 44 is opposite to a direction denoted by the arrow D2 in which the magnetic detection unit 41 is displaced from the reference position of the magnet 43.

The control unit 60A controls the alternating current voltage Vs to be output from the voltage applying unit 50 such that the difference between a detection value of the magnetic field formed by the magnet 43, the detection value being detected by the magnetic detection unit 41, and a detection value of the magnetic field formed by the magnet 44, the detection value being detected by the magnetic detection unit 42, approaches a predetermined value. For example, the control unit 60A causes the switch unit SW1 to enter the ON state before measuring the alternating current voltage Vac, and acquires, as the above-described predetermined value, a result obtained by subtracting the detection value detected by the magnetic detection unit 42 from the detection value detected by the displacement detection unit 41 in the ON state. Thereafter, in the case where the alternating current voltage Vac is measured, the alternating current voltage Vs of the voltage applying unit 50 is controlled such that the detection value detected by the magnetic detection unit 42 is subtracted from the detection value detected by the magnetic detection unit 41, the mean value of the subtraction result is obtained using for example a low-pass filter, and the mean value approaches the predetermined value.

In this manner, according to the noncontact voltage measurement apparatus according to the present embodiment, the alternating current voltage Vs of the voltage applying unit 50 is controlled, using the two magnetic detection units (41, 42) that stand in inverse relationship such that detection values change in opposite directions (when one of the detection values increases, the other detection value decreases) in accordance with the displacement of the movable body 31, such that the difference between the detection values approaches the predetermined value (a value indicating that the movable body 31 is at the neutral position P).

As a result, the displacement of the movable body 31 may be detected with further higher sensitivity, and thus the alternating current voltage Vac may be measured with high resolution and high accuracy.

Figure 4:
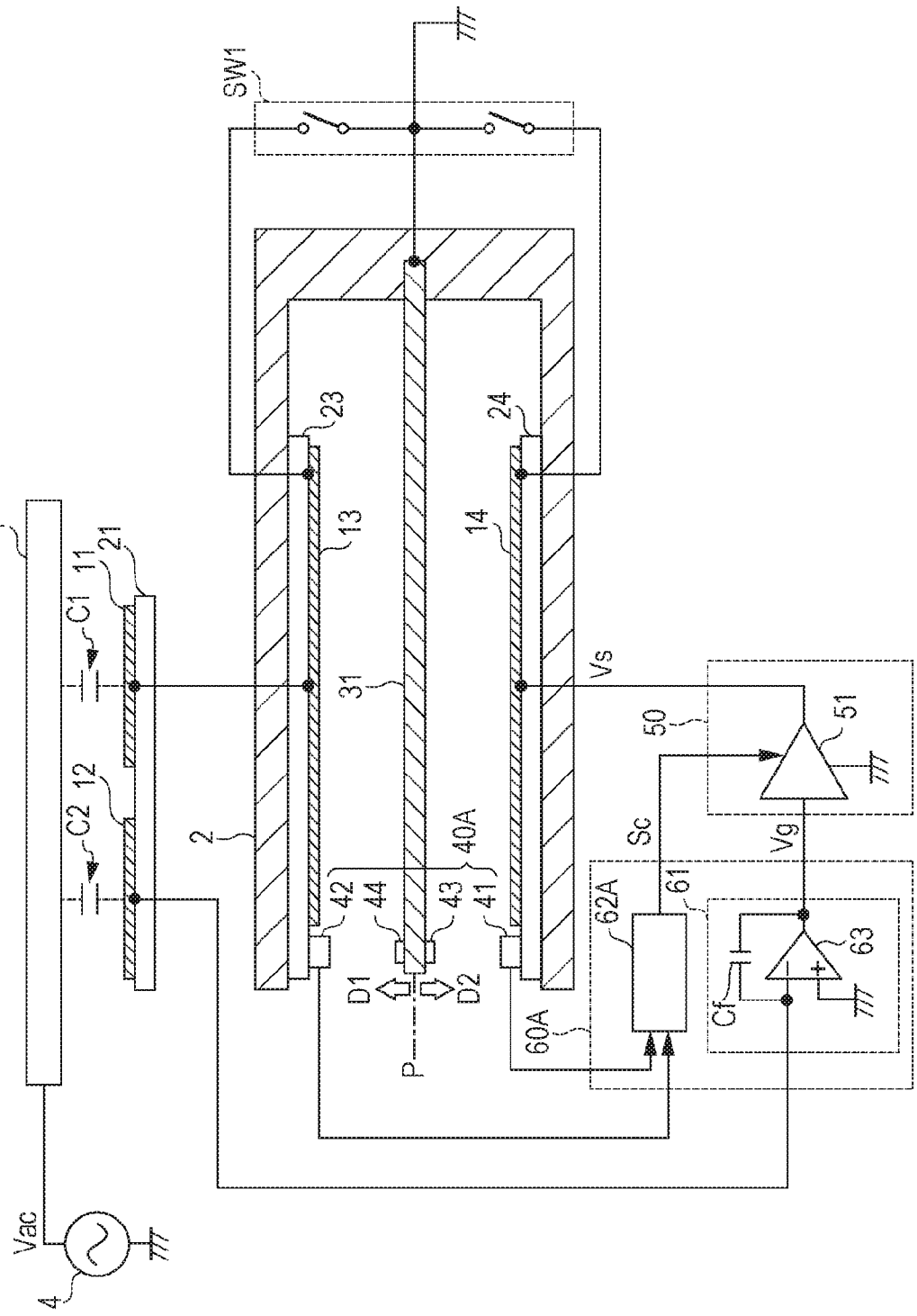
FIG. 4 is a diagram illustrating a modification of the noncontact voltage measurement apparatus according to the third embodiment.

FIG. 4 is a diagram illustrating a modification of the noncontact voltage measurement apparatus according to the third embodiment.

The noncontact voltage measurement apparatus illustrated in FIG. 4 has the second capacitive coupling electrode 12 (FIG. 2), which has already been described, in addition to a configuration substantially the same as that of the noncontact voltage measurement apparatus illustrated in FIG. 3. In addition, a control unit 60A in FIG. 4 is obtained by replacing the gain control unit 62 of the control unit 60 in FIG. 2 with a gain control unit 62A.

The gain control unit 62A obtains, using for example a low-pass filter, the mean value of the difference between the magnetic field detection values detected by the two magnetic detection units 41 and 42. The gain control unit 62A performs negative feedback control on a gain determining the amplitude of the alternating current voltage Vs such that the mean value approaches the predetermined value (the value indicating that the movable body 31 is at the neutral position P).

Fourth Embodiment

Figure 5:
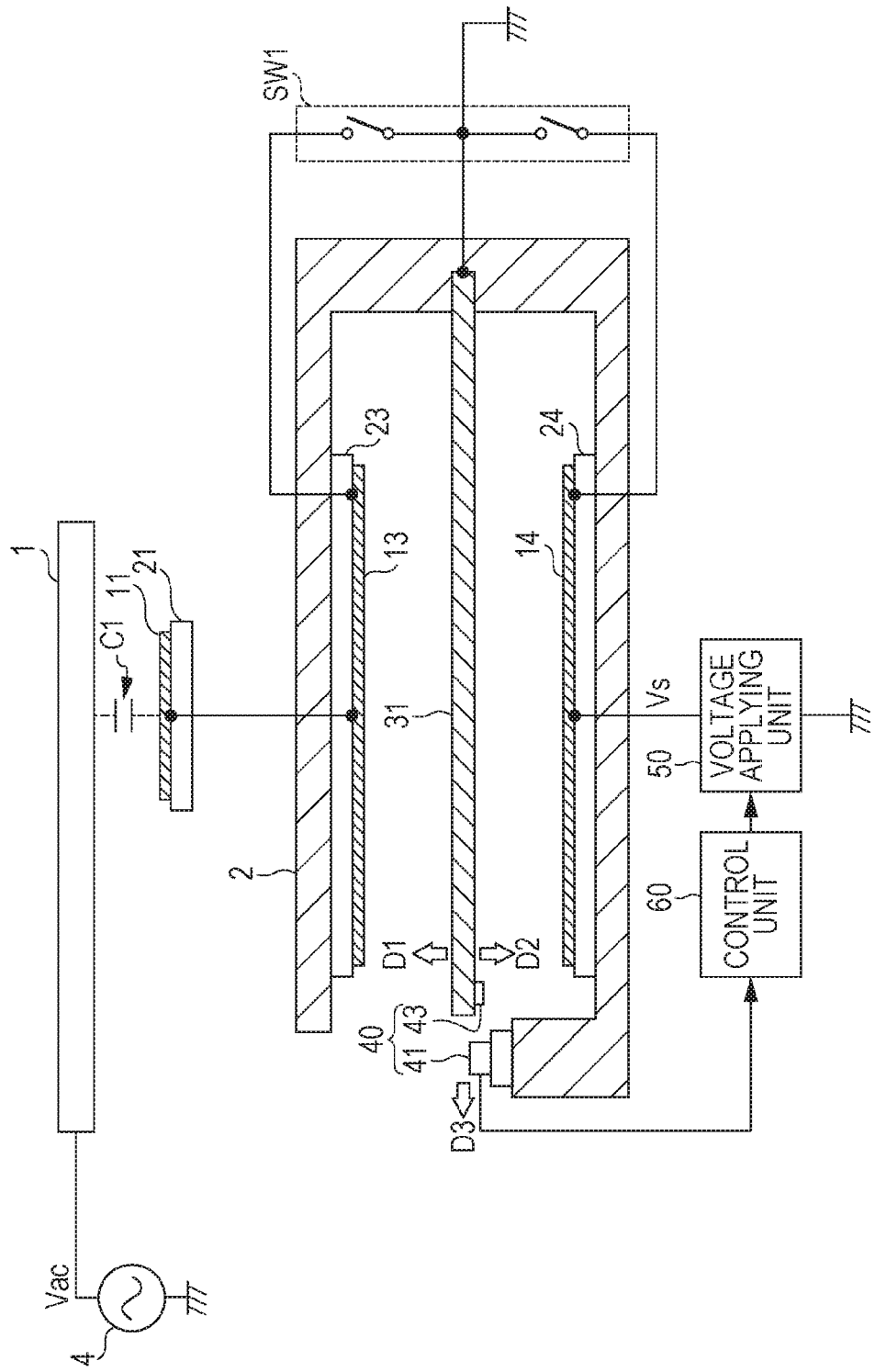
FIG. 5 is a diagram illustrating an example of the configuration of a noncontact voltage measurement apparatus according to a fourth embodiment.

Next, a fourth embodiment of the present invention will be described. FIG. 5 is a diagram illustrating an example of the configuration of a noncontact voltage measurement apparatus according to the fourth embodiment of the present invention. The noncontact voltage measurement apparatus illustrated in FIG. 5 has substantially the same configuration as the noncontact voltage measurement apparatus illustrated in FIG. 1; however, the arrangement of the magnetic detection unit 41 in the displacement detection unit 40 differs from that of the magnetic detection unit 41 in the displacement detection unit 40 of the noncontact voltage measurement apparatus illustrated in FIG. 1. That is, in the noncontact voltage measurement apparatus illustrated in FIG. 5, the magnetic detection unit 41 is installed at the position displaced, with respect to the reference position of the magnet 43 in the case where the movable body 31 is at the neutral position P, in a direction (an arrow D3) perpendicular to the direction in which the movable body 31 is displaced from the reference position.

With this arrangement of the magnetic detection unit 41, the distance between the magnet 43 and the magnetic detection unit 41 becomes shortest in the case where the movable body 31 is at the neutral position P, and the detection value of the magnetic field formed by the magnetic detection unit 41 becomes largest. Thus, even in the case where the width of the displacement of the movable body 31 is relatively large, the magnetic detection unit 41 may be arranged closer to the magnet 43 than in the noncontact voltage measurement apparatuses illustrated in FIGS. 1 to 4, and the position of the movable body 31 may be precisely controlled near the neutral position P.

Fifth Embodiment

Next, a fifth embodiment of the present invention will be described. The displacement of the movable body is detected on the basis of the magnetic field or fields formed by the magnet or magnets in each of the noncontact voltage measurement apparatuses according to the above-described embodiments; however, the displacement of a movable body is detected on the basis of a current caused to flow due to field emission in a noncontact voltage measurement apparatus according to the present embodiment.

Figure 6:
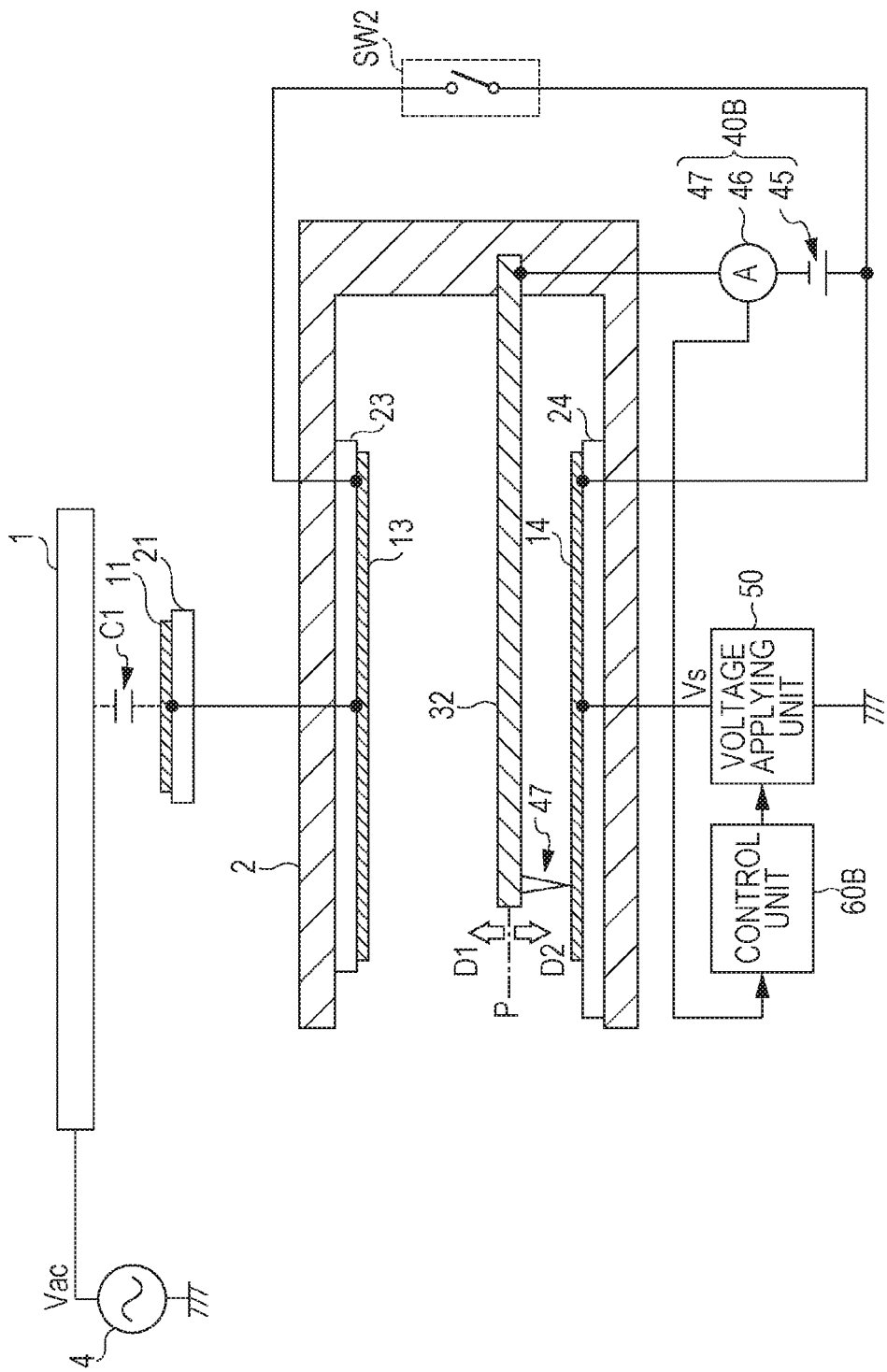
FIG. 6 is a diagram illustrating an example of the configuration of a noncontact voltage measurement apparatus according to a fifth embodiment.

FIG. 6 is a diagram illustrating an example of the configuration of the noncontact voltage measurement apparatus according to the fifth embodiment. The noncontact voltage measurement apparatus illustrated in FIG. 6 is obtained by replacing the movable body 31 of the noncontact voltage measurement apparatus illustrated in FIG. 1 with a movable body 32, by replacing the displacement detection unit 40 with a displacement detection unit 40B, by replacing the control unit 60 with a control unit 60B, and by replacing the switch unit SW1 with a switch unit SW2. The rest of the configuration of the noncontact voltage measurement apparatus illustrated in FIG. 6 is the same as that of the noncontact voltage measurement apparatus illustrated in FIG. 1.

The movable body 32 corresponds to the movable body 31 that is illustrated in for example FIG. 1 and that is disconnected from the ground and connected to the displacement detection unit 40B.

The displacement detection unit 40B has a probe 47, a voltage source 45, and a current detection unit 46.

The probe 47 is a conductor having a tip portion tapered down toward the surface of the feedback electrode 14, and is fixed to the movable body 32.

The voltage source 45 applies a constant voltage between the probe 47 and the feedback electrode 14. In the example of FIG. 6, the movable body 32, which is a conductor, is used as a path for the current flowing from the voltage source 45 to the probe 47. The voltage source 45 applies a direct-current voltage such that the probe 47 has negative polarity and the feedback electrode 14 has positive polarity.

The current detection unit 46 detects the current (tunnel current) caused to flow from the probe 47 to the feedback electrode 14 due to field emission.

The control unit 60B controls the alternating current voltage Vs to be output from the voltage applying unit 50 such that the current (tunnel current) detected by the current detection unit 46 of the displacement detection unit 40B approaches a predetermined reference value indicating that the movable body 32 is positioned at the neutral position P. For example, the control unit 60B includes a computer or a dedicated logic circuit similarly to the control unit 60.

The switch unit SW2 is provided between the sensing electrode 13 and the feedback electrode 14, and short-circuits the sensing electrode 13 and the feedback electrode 14 under control of the control unit 60B.

Here, an operation of the noncontact voltage measurement apparatus having the above-described configuration and illustrated in FIG. 6 will be described.

First, the control unit 60B causes the switch unit SW2 to enter an ON state before measuring the alternating current voltage Vac, and acquires, as the above-described reference value, a detection result from the current detection unit 46 in the ON state. When the switch unit SW2 enters the ON state, the sensing electrode 13 and the feedback electrode 14 have the same electric potential, and the electric charge to be accumulated in the sensing electrode 13 and the feedback electrode 14 is initialized to zero. In this case, no Coulomb force acts on the movable body 32, and thus the movable body 32 is at the predetermined neutral position P. Thus, the reference value that the control unit 60B acquires from the current detection unit 46 when the switch unit SW2 is in the ON state indicates that the movable body 32 is at the neutral position P.

The control unit 60B sets the switch unit SW2 to an OFF state after acquiring the reference value from the displacement detection unit 40B, and starts measuring the alternating current voltage Vac. The control unit 60B controls the output voltage of the voltage applying unit 50 such that the current value detected by the current detection unit 46 becomes equal to the above-described reference value. When the current value detected by the current detection unit 46 becomes nearly equal to the reference value, the movable body 32 is at the neutral position P. Thus, the Coulomb force acting between the sensing electrode 13 and the movable body 32 is almost zero, and the feedback electrode 14 and the sensing electrode 13 have almost the same electric potential. Consequently, the alternating current voltage Vs of the voltage applying unit 50 becomes almost equal to the alternating current voltage Vac of the measurement target 1.

Since the alternating current voltage Vs becomes almost equal to the alternating current voltage Vac, for example, the control unit 60B may acquire an amplitude measurement result of the alternating current voltage Vac on the basis of the waveform of the alternating current voltage Vs output from the voltage applying unit 50. Note that in the case where the control unit 60B includes an analog circuit, a voltage measurement device may be additionally provided to measure the amplitude of the alternating current voltage Vs, and an output from the voltage measurement device may be treated as a measurement result of the alternating current voltage Vac.

As described above, according to the noncontact voltage measurement apparatus according to the present embodiment, the Coulomb force is generated between the movable body 32, which is a conductor, and the sensing electrode 13 to which a voltage corresponding to the alternating current voltage Vac of the measurement target 1 is applied, and the movable body 32 is displaced in accordance with the Coulomb force. In addition, since the elastic force for causing the movable body 32 to return to the predetermined neutral position P acts on the movable body 32, the movable body 32 is displaced in the direction toward the neutral position P when the Coulomb force becomes smaller. The control unit 60B controls the alternating current voltage Vs of the voltage applying unit 50 such that the current due to field emission and detected by the current detection unit 46 approaches the predetermined reference value for the case where the movable body 32 is positioned at the neutral position P. Under this control, the Coulomb force acting on the movable body 32 approaches zero and the alternating current voltage Vs approaches the voltage of the sensing electrode 13. Thus, a measurement value of the alternating current voltage Vac may be acquired from the alternating current voltage Vs of the voltage applying unit 50.

In addition, according to the noncontact voltage measurement apparatus according to the present embodiment, a change in the voltage (V) applied to the feedback electrode 14 leads to a change in the Coulomb force (F) acting on the movable body 32, the change in the Coulomb force (F) leads to a displacement (D) of the movable body 32, and a field emission current (tunnel current) changes in accordance with the displacement (D). From Expressions (1) and (2), the displacement (D), the Coulomb force (F), and the voltage (V) have the following relationship.

$$D \propto F \propto V^2 \qquad (4)$$

Regarding changes in the tunnel current, a general scanning tunneling microscope has a height resolution of about $10 \times 10^{-10}$ m. Thus, even when the displacement of the movable body 32 due to the Coulomb force is significantly small, the displacement of the movable body 32 may be detected with significantly high resolution. Consequently, a measurement value of the alternating current voltage Vac may be acquired with high accuracy.

Figure 7:
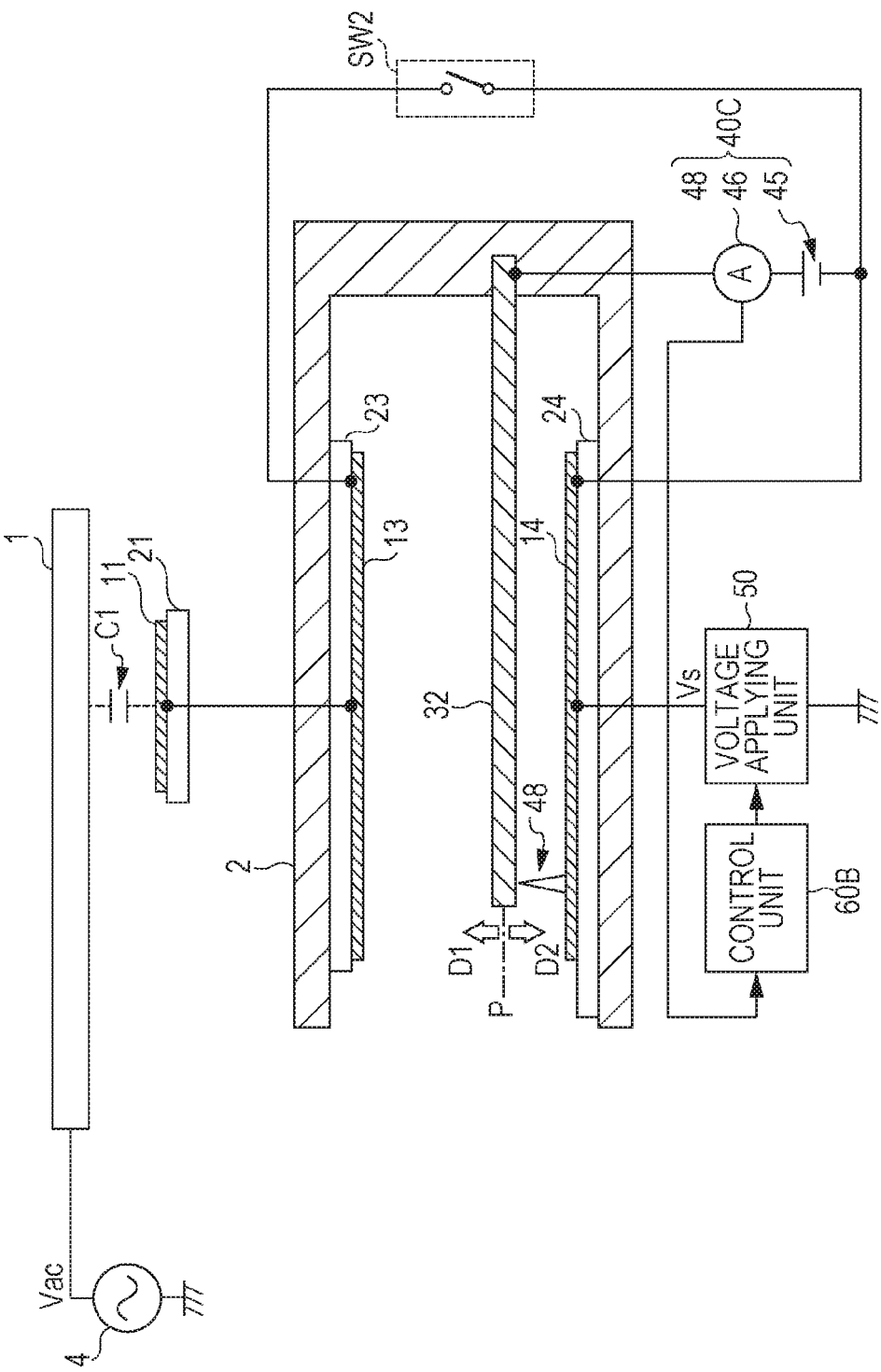
FIG. 7 is a diagram illustrating a modification of the noncontact voltage measurement apparatus according to the fifth embodiment.

FIG. 7 is a diagram illustrating a modification of the noncontact voltage measurement apparatus according to the fifth embodiment.

The probe 47 is provided at the movable body 32 in the noncontact voltage measurement apparatus illustrated in FIG. 6; however, a probe 48 is provided at the feedback electrode 14 in the modification illustrated in FIG. 7. The probe 48 has a tip portion tapered down toward the surface of the movable body 32 as illustrated in FIG. 7. In this case, the voltage source 45 applies a direct-current voltage such that the feedback electrode 14 at which the probe 48 is provided has negative polarity and the movable body 32 has positive polarity.

The present invention is not limited to the above-described embodiments. That is, a person skilled in the art may add various changes to, make a combination or a subcombination of some of, and make a replacement for the constituent elements of the above-described embodiments within the technical scope of the present invention or a scope equivalent to the technical scope.

The examples in which the movable body (31, 32) is positioned between the sensing electrode 13 and the feedback electrode 14 are described in the above-described embodiments; however, the present invention is not limited to these examples. In another embodiment of the present invention, for example as illustrated in FIG. 8, a region of the movable body 31 facing the sensing electrode 13 may be separated from a region of the movable body 31 facing the feedback electrode 14.

Figure 8:
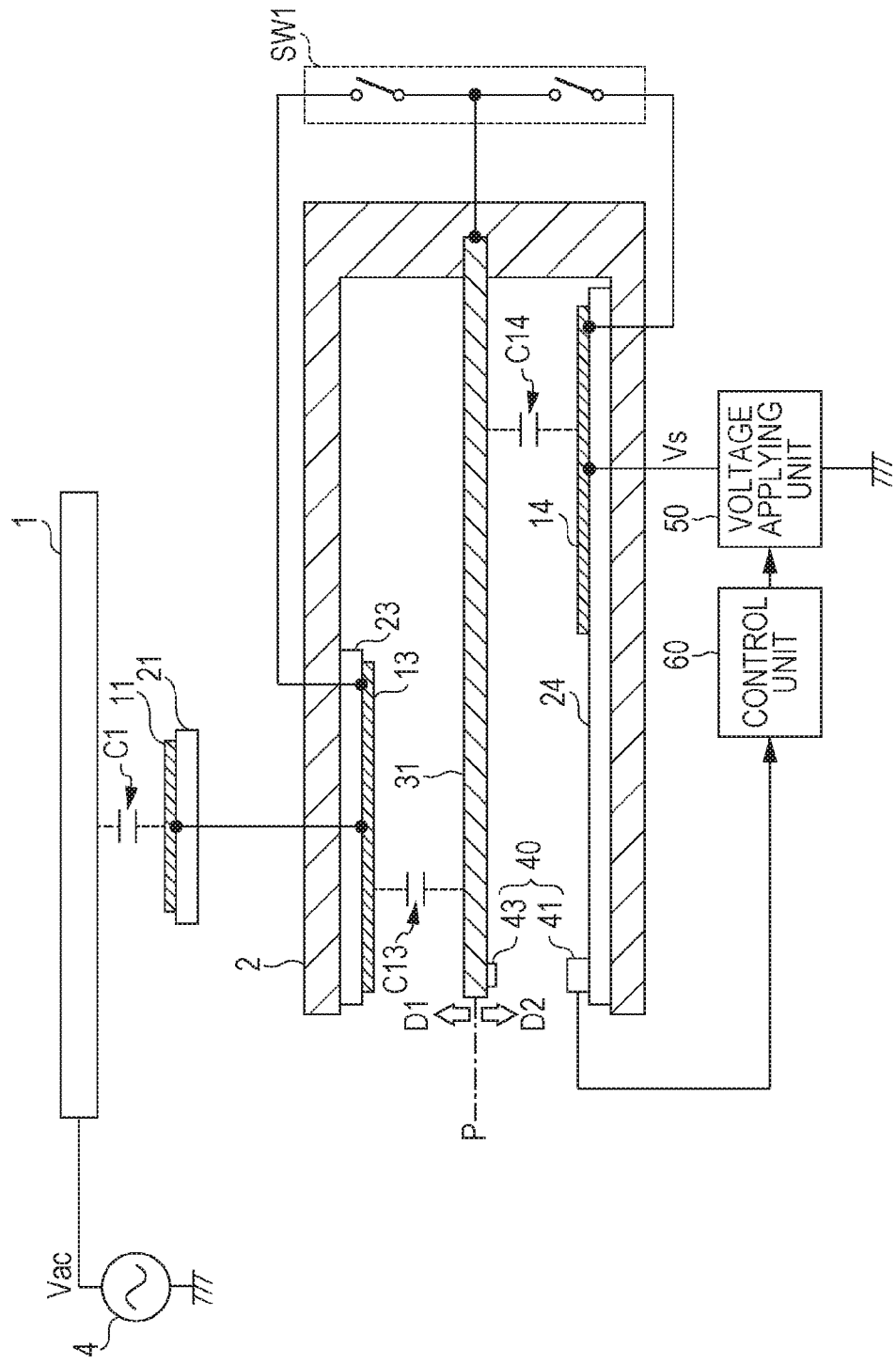
FIG. 8 is a diagram illustrating another modification of the noncontact voltage measurement apparatuses according to the embodiments of the present invention.

A noncontact voltage measurement apparatus illustrated in FIG. 8 is obtained by changing the arrangement of the sensing electrode 13 and the feedback electrode 14 in the noncontact voltage measurement apparatus illustrated in FIG. 1 and by disconnecting the movable body 31 from the ground. The rest of the configuration of the noncontact voltage measurement apparatus illustrated in FIG. 8 is the same as that of the noncontact voltage measurement apparatus illustrated in FIG. 1. In the noncontact voltage measurement apparatus illustrated in FIG. 8, the movable body 31 is isolated from the ground when the alternating current voltage Vac is measured. In this case, a parasitic capacitor C13 formed between the movable body 31 and the sensing electrode 13, a parasitic capacitor C14 formed between the movable body 31 and the feedback electrode 14, and the parasitic capacitor C1 formed between the first capacitive coupling electrode 11 and the measurement target 1 are connected in series. When the alternating current voltage Vac differs from the alternating current voltage Vs, voltages corresponding to capacity ratios between these parasitic capacitors (C1, C13, C14) are generated at the respective parasitic capacitors. The movable body 31 is displaced mainly by the Coulomb force generated between the movable body 31 and the sensing electrode 13. By controlling the alternating current voltage Vs of the voltage applying unit 50 such that the movable body 31 approaches the neutral position P, the alternating current voltage Vs approaches the alternating current voltage Vac.

The examples in which the capacitive coupling electrode or electrodes (11, 12) and the sensing electrode (13) are conductive patterns formed on the different respective substrates (21, 23) are described in the above-described embodiments; however, the present invention is not limited to these examples. In other embodiments according to the present invention, the capacitive coupling electrode or electrodes (11, 12) and the sensing electrode (13) may be conductive patterns formed at different positions (for example, the front surface and the back surface) of a common substrate, or a portion or portions of a common conductive member may be used as the capacitive coupling electrode or electrodes (11, 12) and another portion of the common conductive member may be used as the sensing electrode (13).

The displacement detection unit using the magnet and the magnetic detection unit is taken as an example in the above-described embodiments; however, the present invention is not limited to this example. For example, a displacement detection unit that detects a capacitance due to a change in the distance to the movable body may be used in the present invention.

In the examples of the noncontact voltage measurement apparatuses illustrated in FIGS. 1 to 5 and 8, the magnet is fixed to the movable body, and the magnetic detection unit is fixed to the base; however, the present invention is not limited to these examples. In another embodiment according to the present invention, the magnetic detection unit may be fixed to the movable body and the magnet may be fixed to the base.

A cantilever one end of which is fixed and the other end of which is open is taken as an example of the movable body in the above-described embodiments; however, the present invention is not limited to this example. For example, movable bodies having various configurations such as a configuration in which the corners (the sides) of a plate type rectangular conductor are fixed to the base using an elastic material may be used in the present invention.

What is claimed is:

1. A noncontact voltage measurement apparatus for measuring, without being electrically directly connected to a conductive measurement target, an alternating voltage applied to the measurement target, the noncontact voltage measurement apparatus comprising:
   a sensing electrode to which a first voltage corresponding to the alternating voltage is applied;
   a feedback electrode to which a second voltage is applied, the second voltage being an alternating voltage;
   a conductive movable body that is movably supported, the movable body being displaced in accordance with a first Coulomb force generated between the movable body and the sensing electrode and a second Coulomb force generated between the movable body and the feedback electrode, the movable body being subject to an elastic force that causes the movable body to return to a predetermined neutral position;
   a displacement detection unit that detects a displacement of the movable body with respect to the predetermined neutral position and outputs a detection result corresponding to the displacement;
   a voltage applying unit that applies the second voltage to the feedback electrode; and
   a control unit that controls the second voltage output from the voltage applying unit such that the detection result approaches a predetermined reference value indicating the neutral position of the movable body.

2. The noncontact voltage measurement apparatus according to claim 1, further comprising:
   a first capacitive coupling electrode that is capacitively coupled to the measurement target and is electrically connected to the sensing electrode.

3. The noncontact voltage measurement apparatus according to claim 1, further comprising:
   a switch unit having an ON state to short-circuit the sensing electrode and the feedback electrode, and an OFF state to electrically disconnect the sensing electrode from the feedback electrode, wherein the control unit sets the detection result obtained from the displacement detection unit by causing the switch unit to enter the ON state as the reference value before measuring the alternating current voltage, and causes the switch unit to enter the OFF state when measuring the alternating current voltage.

4. The noncontact voltage measurement apparatus according to claim 2, further comprising:

a second capacitive coupling electrode that is capacitively coupled to the measurement target and outputs a signal corresponding to the alternating voltage of the measurement target, wherein and the control unit includes:

an alternating current signal generation unit that generates an alternating current signal proportional to the alternating voltage of the measurement target based on the signal output from the second capacitive coupling electrode; and a gain control unit that outputs a gain control signal, and wherein the voltage applying unit amplifies the alternating current signal with a gain corresponding to the gain control signal, the control unit adjusting the gain control signal such that the detection result from the displacement detection unit approaches the reference value.

5. The noncontact voltage measurement apparatus according to claim 1, further comprising:

a base that supports the sensing electrode, the feedback electrode, and the movable body, wherein the displacement detection unit includes:

a magnet; and a magnetic detection unit that detects a magnetic field formed by the magnet, wherein one of the magnet and the magnetic detection unit is disposed on the movable body as a moving element, and the other of the magnet and the magnetic detection unit is provided on the base as a fixed element, and wherein the displacement detection unit outputs the detection result representing the magnetic field detected by the magnetic detection unit.

6. The noncontact voltage measurement apparatus according to claim 5, wherein when a position of the moving element disposed on the movable body in the neutral position is defined as a reference position, the fixed element on the base is disposed at a position shifted from the reference position in a direction perpendicular to a direction of movement of the moving element when the movable body is displaced from the neutral position.

7. The noncontact voltage measurement apparatus according to claim 5, wherein when a position of the moving element disposed on the movable body in the neutral position is defined as a reference position, the fixed element on the base is disposed at a position shifted from the reference position in a direction parallel to a direction of movement of the moving element when the movable body is displaced from the neutral position.

8. The noncontact voltage measurement apparatus according to claim 7, further comprising another magnetic detection unit identical to the magnetic detection unit so as to form a pair of first and second magnetic detection units disposed on the base, wherein the first magnetic detection unit is disposed at a first position shifted toward a first side from the reference position of the magnet in a first direction parallel to the direction of movement of the magnet when the movable body is displaced from the neutral position, while the second magnetic detection unit is disposed at a second position shifted toward a second side from the reference position of the magnet in a second direction opposite to the first direction, and wherein the control unit controls the second voltage such that a difference between a first detection value of the magnetic field detected by the first magnetic detection unit, and a second detection value of the magnetic field detected by the second magnetic detection unit approaches a predetermined value.

9. The noncontact voltage measurement apparatus according to claim 1, wherein the displacement detection unit includes:

a conductive probe provided at the movable body and having a tip portion tapered down toward a surface of the feedback electrode or a conductive probe provided at the feedback electrode and having a tip portion tapered down toward a surface of the movable body;

a voltage source that applies a voltage between the probe and the feedback electrode, and a current detection unit that detects a current caused to flow from the probe to the feedback electrode due to field emission, and wherein the displacement detection unit outputs the detection result representing the current detected by the current detection unit.

10. The noncontact voltage measurement apparatus according to claim 1, wherein:

the sensing electrode and the feedback electrode are arranged so as to face each other; and at least a portion of the movable body is positioned between the sensing electrode and the feedback electrode.

11. A noncontact voltage measurement apparatus for measuring, without being electrically directly connected to a conductive measurement target, an alternating voltage applied to the measurement target, the noncontact voltage measurement apparatus comprising:

a base having a first substrate and a second substrate opposing the first substrate with a space interposed therebetween;

a sensing electrode disposed on the first substrate, a first voltage corresponding to the alternating voltage of the measurement target being applied to the sensing electrode;

a feedback electrode disposed on the second substrate so as to oppose the sensing electrode, a second voltage being applied to the feedback electrode, the second voltage being an alternating voltage;

an elastic conductive movable body movably supported between the sensing electrode and the feedback electrode by the base, the movable body being displaced toward the sensing electrode or the feedback electrode in accordance with a first Coulomb force generated between the movable body and the sensing electrode and a second Coulomb force generated between the movable body and the feedback electrode, an elastic force of the movable body causing the movable body to return to a predetermined neutral position;

a pair of displacement detection units that detect a displacement of the movable body with respect to the predetermined neutral position, the pair of displacement detection units including:
a first detection unit including:
   a first magnet disposed on a first surface of the movable body facing the sensing electrode; and
   a first magnetic detection unit disposed on the first substrate, the first magnetic detection unit detecting a first magnetic field formed by the first magnet so as to output a first detection result; and
a second detection unit including:
   a second magnet disposed on a second surface of the movable body facing the feedback electrode; and
   a second magnetic detection unit disposed on the second substrate, the second magnetic detection unit detecting a second magnetic field formed by the second magnet so as to output a second detection result;
a voltage applying unit that applies the second voltage to the feedback electrode; and
a control unit that controls the second voltage output from the voltage applying unit such that a difference between the first and second detection results approaches a predetermined reference value indicating the neutral position of the movable body.

12. The noncontact voltage measurement apparatus according to claim 11, wherein the first and second magnets and the first and second magnetic detection units are aligned in a direction parallel to a direction of displacement of the movable body.

* * * * *